United States Patent
Hohage et al.

(10) Patent No.: US 7,867,917 B2
(45) Date of Patent: Jan. 11, 2011

(54) ETCH STOP LAYER FOR A METALLIZATION LAYER WITH ENHANCED ADHESION, ETCH SELECTIVITY AND HERMETICITY

(75) Inventors: Joerg Hohage, Dresden (DE); Matthias Lehr, Dresden (DE); Volker Kahlert, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 604 days.

(21) Appl. No.: 11/456,116

(22) Filed: Jul. 7, 2006

(65) Prior Publication Data

US 2007/0099010 A1    May 3, 2007

(30) Foreign Application Priority Data

Oct. 31, 2005    (DE)    ...................... 10 2005 052 052

(51) Int. Cl.
    *H01L 21/00* (2006.01)
(52) U.S. Cl. .................................. 438/775; 257/E23.16
(58) Field of Classification Search ................. 438/970, 438/775, 627, 643, 653; 257/751, E23.16, 257/E21.584
See application file for complete search history.

(56) References Cited

U.S. PATENT DOCUMENTS

| | | | |
|---|---|---|---|
| 6,069,069 A | * | 5/2000 | Chooi et al. ................. 438/634 |
| 6,798,043 B2 | | 9/2004 | Steiner et al. ................ 257/637 |
| 6,939,800 B1 | * | 9/2005 | Lu et al. ...................... 438/643 |
| 7,476,626 B2 | * | 1/2009 | Hohage et al. ............... 438/763 |
| 2003/0109129 A1 | * | 6/2003 | Saito et al. ................... 438/627 |
| 2004/0067308 A1 | * | 4/2004 | Zheng et al. ........... 427/249.15 |
| 2004/0084680 A1 | * | 5/2004 | Ruelke et al. .................. 257/77 |
| 2004/0185674 A1 | * | 9/2004 | M'Saad et al. ............... 438/761 |
| 2005/0042889 A1 | * | 2/2005 | Lee et al. ..................... 438/780 |
| 2005/0153537 A1 | * | 7/2005 | Cheng et al. ................. 438/627 |

OTHER PUBLICATIONS

Double Patent/Copending claims U.S. Appl. No. 11/426,970, pp. 1-4.*

* cited by examiner

*Primary Examiner*—Ha Tran T Nguyen
*Assistant Examiner*—Shaun Campbell
(74) *Attorney, Agent, or Firm*—Williams, Morgan & Amerson, P.C.

(57) ABSTRACT

By providing a barrier layer stack including a thin SiCN layer for enhanced adhesion, a silicon nitride layer for confining a copper-based metal region (thereby also effectively avoiding any diffusion of oxygen and moisture into the copper region), and a SiCN layer, the total relative permittivity may still be maintained at a low level, since the thickness of the first SiCN layer and of the silicon nitride layer may be moderately thin, while the relatively thick silicon carbide nitride layer provides the required high etch selectivity during a subsequent patterning process of the low-k dielectric layer.

16 Claims, 5 Drawing Sheets

ETCH STOP LAYER FOR A METALLIZATION LAYER WITH ENHANCED ADHESION, ETCH SELECTIVITY AND HERMETICITY

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material having low permittivity to enhance device performance.

2. Description of the Related Art

In modern integrated circuits, minimum feature sizes, such as the channel length of field effect transistors, have reached the deep sub-micron range, thereby steadily increasing performance of these circuits in terms of speed and power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip. In integrated circuits having minimum dimensions of approximately 0.35 μm and less, a limiting factor of device performance is the signal propagation delay caused by the switching speed of the transistor elements. As the channel length of these transistor elements has now reached 0.18 μm and less, it turns out, however, that the signal propagation delay is no longer limited by the field effect transistors, but is limited, owing to the increased circuit density, by the close proximity of the interconnect lines, since the line-to-line capacitance is increased in combination with a reduced conductivity of the lines due to their reduced cross-sectional area. The parasitic RC time constants, therefore, require the introduction of a new type of material for forming the metallization layer.

Traditionally, metallization layers are formed by a dielectric layer stack including, for example, silicon dioxide and/or silicon nitride, with aluminum as the typical metal. Since aluminum exhibits significant electromigration at higher current densities that may be necessary in integrated circuits having extremely scaled feature sizes, aluminum is being replaced by copper, which has a significantly lower electrical resistance and a higher resistivity against electromigration. For devices having feature sizes of 0.13 μm and less, it turns out that simply replacing aluminum with copper does not provide the required decrease of the parasitic RC time constants, and, therefore, the well-established and well-known dielectric materials silicon dioxide ($k\approx 4.2$) and silicon nitride ($k\approx 7$) are increasingly replaced by so-called low-k dielectric materials. However, the transition from the well-known and well-established aluminum/silicon dioxide metallization layer to a low-k dielectric/copper metallization layer is associated with a plurality of issues to be dealt with.

For example, copper may not be deposited in higher amounts in an efficient manner by well-established deposition methods, such as chemical and physical vapor deposition. Moreover, copper may not be efficiently patterned by well-established anisotropic etch processes and therefore the so-called damascene technique is employed in forming metallization layers including copper lines. Typically, in the damascene technique, the dielectric layer is deposited and then patterned with trenches and vias that are subsequently filled with copper by plating methods, such as electroplating or electroless plating. Also, the damascene technique is presently a well-established technique for forming copper metallization layers in standard dielectric materials, such as silicon dioxide. The employment of low-k dielectrics requires the development of new dielectric diffusion barrier layers to avoid copper contamination of adjacent material layers, as copper readily diffuses in a plurality of dielectrics. Although silicon nitride is known as an effective copper diffusion barrier, which may also efficiently avoid the diffusion of, for instance, oxygen into the copper-based metal, silicon nitride may not be acceptable in certain applications using low-k dielectric layer stacks, owing to its high permittivity and also reduced etch selectivity in sophisticated via etch processes. Therefore, presently, silicon carbide is considered as a viable candidate for a copper diffusion barrier. It turns out, however, that copper's resistance against electromigration strongly depends on the interface between the copper and the adjacent diffusion barrier layer, and, therefore, in sophisticated integrated circuits featuring high current densities, it is generally preferable to use up to 20% nitrogen in the silicon carbide layer, thereby remarkably improving the electromigration behavior of copper compared to pure silicon carbide.

With reference to FIGS. 1*a*-1*e*, a typical conventional process flow will now be described to explain the problems involved in forming a metallization layer including copper and a low-k dielectric in more detail. FIG. 1*a* schematically shows a cross-sectional view of a semiconductor structure 100, in which a low-k dielectric material is to be patterned in accordance with a so-called via first/trench last process sequence, which is presently considered as a very promising process scheme in patterning low-k dielectrics. The semiconductor structure 100 comprises a substrate 101 that may include circuit elements, such as transistors, resistors, capacitors and the like, and which may include a lower metallization layer 102 including a metal region 103 embedded in a dielectric material 104. Depending on the level of the lower metallization layer 102, the metal region 103 may comprise copper and the dielectric 104 may be a low-k dielectric, such as hydrogen-containing silicon oxycarbide (SiCOH). A barrier layer 105 formed of nitrogen-containing silicon carbide (SiCN), which also serves as an etch stop layer in the following etch procedure for patterning an overlying low-k dielectric layer 106, is formed on the metallization layer 102, thereby confining the metal region 103. The low-k dielectric layer 106 may comprise, depending on the process sequence used, an intermediate etch stop layer (not shown), which in many applications may, however, be omitted for the benefit of a reduced total permittivity. The low-k dielectric material in the layer 106 may be comprised of any appropriate low-k dielectric material, such as SiCOH and the like. A cap layer 108, for example comprised of silicon dioxide or provided as an anti-reflective coating (ARC), may optionally be located on the low-k dielectric layer 106 and may then serve as a stop layer in removing excess copper in a subsequent chemical mechanical polishing (CMP) process. A resist mask 109 including an opening 110 is formed above the optional cap layer 108.

A typical process flow for forming the semiconductor structure 100 as shown in FIG. 1*a* may comprise the following steps. After planarizing the lower metallization layer 102, the barrier/etch stop layer 105 is deposited, for example, by a plasma enhanced chemical vapor deposition (PECVD) from trimethyl silane (3MS) and ammonia ($NH_3$) as precursor gases. Then, the hydrogen-containing silicon oxycarbide is deposited, wherein, if required, the optional etch stop layer may be formed when a first thickness corresponding to a trench depth is obtained during the deposition of the dielectric layer 106. Thereafter, the deposition of the layer 106 may be resumed to achieve the required final thickness of the layer 106. Next, the cap layer 108, if required, is deposited with a specified thickness. The cap layer 108 may help to substantially reduce any interaction of the low-k dielectric of the layer 106 with the overlying resist mask 109 and may serve as a CMP stop layer. Then, the resist mask 109 is patterned in accordance with well-established deep UV lithography techniques to form the opening 110, determining the dimensions of the vias to be formed within the dielectric layer 106.

FIG. 1b schematically shows the semiconductor structure 100 after an anisotropic etch process for forming a via 111 in the cap layer 108 and the dielectric layer 106. During the anisotropic etch procedure, the barrier/etch stop layer 105 exhibits a significantly lower etch rate than the surrounding dielectric layer 106, so that the etch process may be stopped in or on the layer 105, wherein the layer 105 comprised of SiCN may exhibit an enhanced etch selectivity compared to an SiN layer as may frequently be used for an etch stop layer. Thereafter, the remaining photoresist not consumed during the anisotropic etch process is removed by an etch step in an oxygen-containing plasma ambient. It should be noted that the etch stop layer 105 may not suppress oxygen diffusion into the metal region 103 during resist ashing and any other subsequent manufacturing processes as efficiently as an SiN layer and hence the copper integrity may be reduced.

FIG. 1c schematically shows the semiconductor structure 100 in an advanced manufacturing stage. The via 111 is filled with an organic anti-reflective coating material to form a via plug 114, while the organic material is also provided at the remaining surface of the structure 100 to form an anti-reflective coating layer 112 for the subsequent photolithography. Thus, the plug 114 and the anti-reflective coating 112 serve to planarize the topography of the semiconductor structure 100 prior to the formation of a further photoresist mask 113 including a trench opening 115. The via plug 114 and the anti-reflective coating layer 112 may be formed by spin-on techniques and the like, and the photoresist mask 113 may be formed by sophisticated lithography methods, as are well known in the art.

FIG. 1d schematically shows the semiconductor structure 100 after completion of the trench forming step and removal of the layer 112 and the plug 114. That is, a trench 117 is formed in the underlying cap layer 108 and the upper portion of the dielectric layer 106. The trench 117 may be formed on the basis of well-established etch techniques. Subsequently, the etch stop layer 105 may be completely opened. During this etch process, the degree of "over-etching" of the copper region 103 may depend on the uniformity of the previous etch process for forming the via opening 111 and thus on the selectivity of the etch stop layer 105, since a reduced etch selectivity may result in reduced thickness uniformity of the etch stop layer 105 within the via opening 111 after the via etch process. After etching through the etch stop layer 105 within the opening 111, a barrier metal and a copper-based metal may be filled in the trench 117 and the via opening 111.

FIG. 1e schematically shows the semiconductor structure 100 after completion of the above-described process sequence, thereby forming a metallization layer 130. The metallization layer 130 comprises the trench 117 and the via 111 filed with a copper-based metal 119, wherein a barrier metal layer 118 is formed on inner sidewalls of the trench 117 and via 111 and on the bottom surfaces thereof. A surface 120 of the metallization layer 130 is planarized to allow the formation of a further metallization layer.

Typically, the barrier metal layer 118 may be deposited by physical vapor deposition, such as sputter deposition, with a thickness that insures sufficient protection against copper out-diffusion and at the same time provides the required adhesion to the surrounding low-k dielectric material. Typically, tantalum or tantalum nitride may be used as material for the barrier metal layer 118. Subsequently, a copper seed layer is deposited to promote the subsequent deposition of the bulk copper by electroplating. Then, the excess copper is removed by chemical mechanical polishing, wherein the cap layer 108 may also be removed, at least partially, and may act as a stop layer, to reliably control the CMP process. Thereafter, a further etch top layer, such as the layer 105, may be deposited to confine the copper and provide a reliable etch stop during the formation of a subsequent metallization layer.

The electromigration of copper strongly depends on the characteristics of the interface to the surrounding material. It is therefore important to maintain the integrity of the copper-based metal at regions 121, in which the copper of the metal region 103 is in contact with the barrier/etch stop layer 105 or with an etch stop layer still to be formed on the metal 119. As previously explained, the SiNC material of the layer 105 may have, despite its superior behavior in view of etch selectivity and permittivity, a reduced diffusion blocking effect with respect to, for instance, moisture and oxygen compared to SiN. Hence, reduced performance of the metal region 103 or 119 may result, thereby compromising the overall performance of the device 100.

In view of the above problems, a need exists for a technique that maintains superior barrier characteristics while avoiding, or reducing the effects of, one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a semiconductor device and a method for manufacturing the same that provide an enhanced moisture and oxygen diffusion blocking effect while, nevertheless, a required high degree of etch selectivity is maintained. Additionally, the adhesion of the etch stop layer to the underlying copper-based material may be maintained at a high level, thereby contributing to, in combination with an increased integrity of the metal surface achieved by the enhanced moisture and oxygen diffusion blocking effect, an enhanced resistance against electromigration. This may be accomplished by providing a dielectric barrier layer stack in which an excellent adhesion is achieved by a first dielectric layer and also an efficient confinement of the copper-based metal is provided by a second dielectric layer, while superior control of a subsequent etch process may be accomplished by providing a third dielectric layer having enhanced etch selectivity and an increased thickness compared to the first and second dielectric layers to enable a reliable stop of the etch process under consideration.

According to one illustrative embodiment of the present invention, a semiconductor device comprises a metal-containing region and a low-k dielectric layer formed above the metal-containing region. Moreover, a barrier layer stack is formed between the metal-containing region and the low-k dielectric layer. The barrier layer stack comprises a first dielectric layer formed on the metal-containing region and having a first thickness, a second dielectric layer formed on the first dielectric layer and having a second thickness, and a third dielectric layer formed on the second dielectric layer and having a third thickness. The first thickness and the second thickness are each less than the third thickness.

According to another illustrative embodiment of the present invention, a method comprises depositing a first dielectric layer having a first thickness on a metal region formed above a substrate. The method further comprises depositing a second dielectric layer in situ on the first dielectric layer, wherein the second dielectric layer has a second thickness. Furthermore, a third dielectric layer having a third thickness is deposited on the second dielectric layer, wherein the first and second thicknesses are each less than the third thickness. Finally, a low-k dielectric layer is formed above the third dielectric layer.

According to yet another illustrative embodiment of the present invention, a method comprises forming a low-k dielectric barrier layer stack on a metal region in a metallization structure of a semiconductor device by depositing in situ according to the following order: a nitrogen-containing silicon carbide (SiCN) layer, a silicon nitride layer and a nitrogen-containing silicon carbide (SiCN) layer.

BRIEF DESCRIPTION OF THE DRAWINGS

The invention may be understood by reference to the following description taken in conjunction with the accompanying drawings, in which like reference numerals identify like elements, and in which.

Figure 1A:
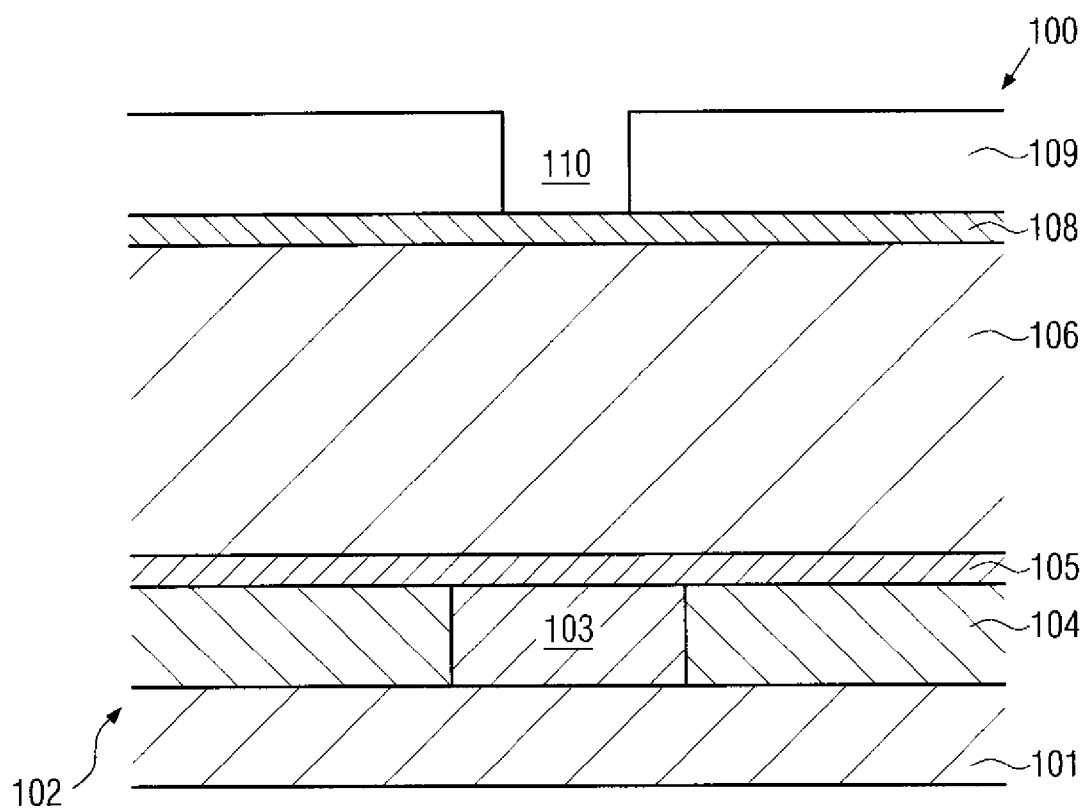
FIGS. 1a-1e schematically show cross-sectional views of a semiconductor structure including a low-k metallization layer during various manufacturing stages in accordance with a conventional dual damascene process.
Figure 1B:
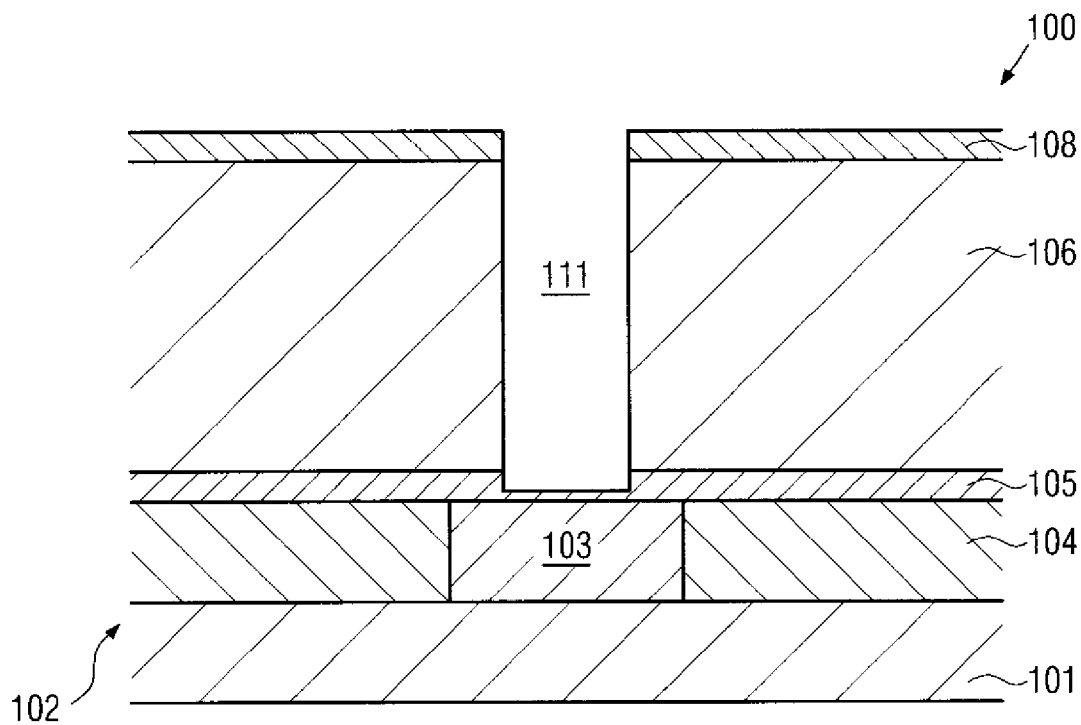
Figure 1C:
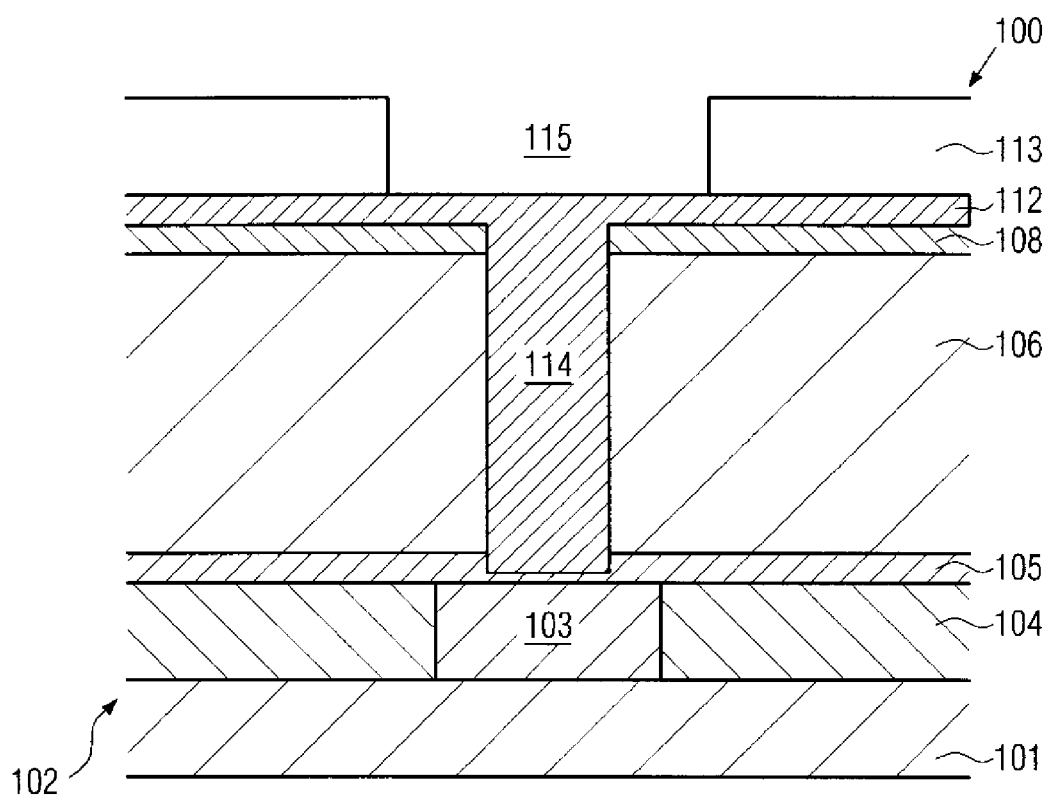
Figure 1D:
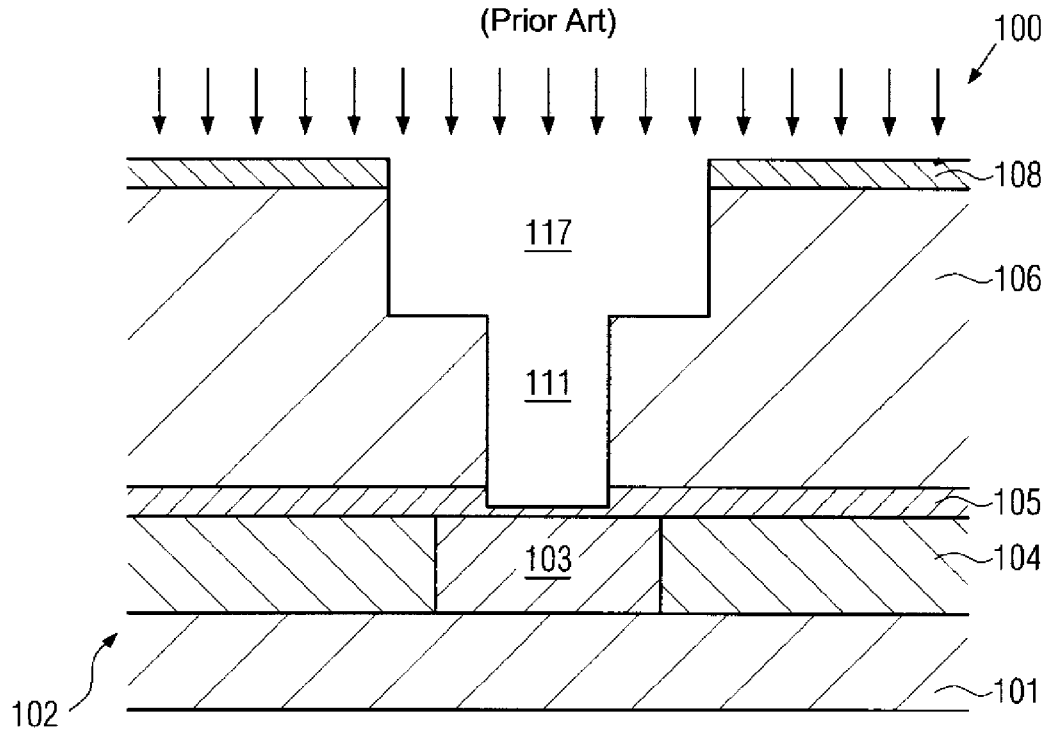
Figure 1E:
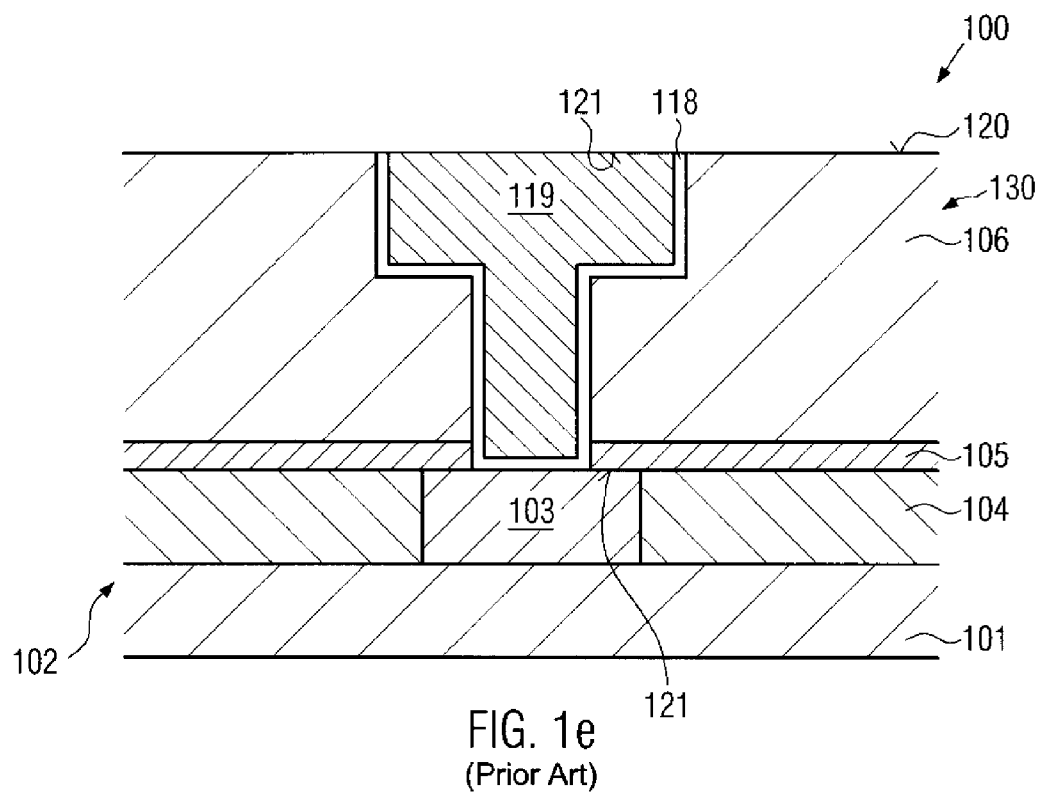

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention relates an efficient technique for the formation of an efficient barrier layer that has a moderately low relative permittivity and also provides a required high etch selectivity during the patterning of a low-k dielectric material in sophisticated metallization layers of highly advanced semiconductor devices, wherein an adhesion to the underlying metal region is maintained at a high level, thereby providing a "strong" interface with a reduced tendency for stress-induced metal migration, such as electromigration. For example, nitrogen-containing silicon carbon (SiCN) may exhibit an excellent adhesion to copper, in particular in combination with an appropriate pretreatment prior to the actual SiCN deposition. For instance, the coefficient $G_C$, describing the energy required for removing a material from a surface, may be $>20$ J/m$^2$ for SiCN formed on a copper surface when measured for a blanket substrate, which compares to, for instance, $G_C<10$ J/m$^2$ for a silicon nitride layer.

In order to obtain an overall performance gain for the barrier layer, in the present invention, it is contemplated that an efficient confinement of copper-based metal trenches may be accomplished by providing a thin dielectric layer which provides enhanced copper confinement and which also efficiently suppresses the diffusion of moisture and oxygen into the copper, thereby significantly enhancing the surface integrity of the copper-based surface. Additionally, a thin adhesion layer is provided that is in contact with the metal, thereby further enhancing the strength of the resulting interface metal/dielectric. For example, silicon nitride is a well-approved material that effectively suppresses oxygen diffusion therethrough and, thus, may represent a highly appropriate material for forming a dielectric layer for reducing oxygen and moisture diffusion into the copper. Contrary to conventional approaches, in the present invention, however, the corresponding layer thickness may be selected relatively thin, for instance in the range of approximately 5-20 nm, thereby maintaining the influence on the overall relative permittivity of the resulting barrier layer stack at a moderately low level. Moreover, the moderately thin barrier layer having the enhanced oxygen and moisture diffusion blocking effect is provided in combination with a dielectric layer of enhanced adhesion, which in one illustrative embodiment is comprised of a nitrogen-containing silicon carbide layer that is formed directly on the metal surface, wherein a thickness of the adhesion layer may be significantly less compared to conventional techniques using a single SiCN barrier layer, as is previously described. Thus, in advanced devices, the thickness of the SiCN layer may range from approximately 5-30 nm. Furthermore, the above layers may be combined with a third dielectric layer, which substantially acts as an efficient etch stop layer and also substantially determines the overall relative permittivity of the total barrier layer stack. In illustrative embodiments of the present invention, nitrogen-enriched silicon carbide may be used with a significantly higher thickness compared to the first and second dielectric layers so as to allow a reliable control of the corresponding via etch process while, nevertheless, maintaining the relative permittivity at the required low level. In one illustrative embodiment, the deposition of the barrier layer stack may be accomplished in an in situ process, i.e., by means of a deposition process in which the vacuum is maintained throughout the whole process, thereby simplifying the process complexity and also reducing copper defects and substrate contamination.

Figure 2A:
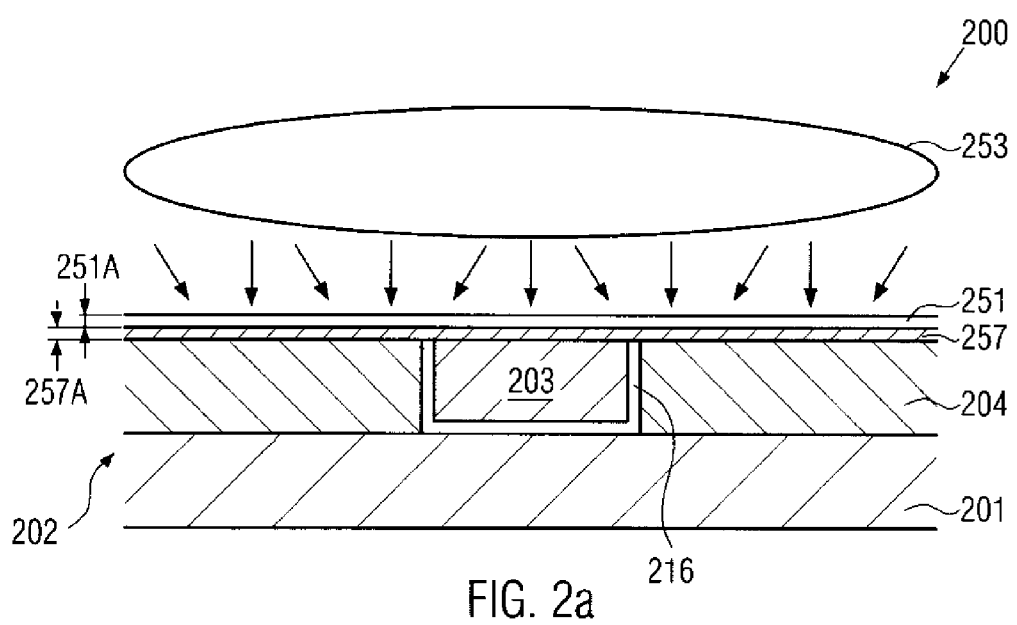
FIGS. 2a-2e schematically show cross-sectional views of a semiconductor structure during the formation of a metallization layer, including a dielectric barrier layer stack providing enhanced adhesion, confinement and etch selectivity in accordance with illustrative embodiments of the present invention.

With reference to FIGS. 2a-2e, further illustrative embodiments of the present invention will now be described in more detail. FIG. 2a schematically shows a semiconductor structure 200 in cross-sectional view according to further illustrative embodiments of the present invention. The semiconductor structure 200 comprises a substrate 201, above which a metal region 203 may be located, to which a vertical electrical connection is to be formed. For example, in highly sophisticated applications, semiconductor devices may require a plurality of metallization layers, as is previously explained, to provide the high number of electrical connections. Consequently, in illustrative embodiments, a first metallization layer 202 may be formed above the substrate 201, wherein, as previously explained with reference to FIGS. 1a-1e, the substrate 201 may include any circuit elements, such as transistors, resistors, capacitors and the like, for which the first metallization layer 202 provides electrical contact according to a specified circuit layout. The first metallization layer 202 may represent the very first metallization layer or may represent an intermediate metallization layer, above which one or more additional metallization layers are to be formed. The first metallization layer 202 may include a first dielectric layer 204, which may comprise a low-k dielectric material and may also include the metal region 203 embedded in the dielectric material of the layer 204. In illustrative embodiments, the metal region 203 may be comprised of copper or copper alloys, wherein, advantageously, a conductive barrier layer 216 may be provided between the dielectric material 204 and the copper-based metal of the metal region 203. A first dielectric layer 257, which is a part of a dielectric barrier layer stack, is formed above the first metallization layer 202 to be in contact with the metal region 203. The first dielectric layer 257 may be formed of a material that ensures a good adhesion to the material of the metal region 203, thereby ensuring a high resistance against stress-induced material migration, such as electromigration. For example, nitrogen-containing silicon carbide, which will also be referred to as SiCN, irrespective of its actual nitrogen content, is a suitable candidate due to its excellent adhesion to copper. Since a thickness 257A of the layer 257 may be selected moderately small, the nitrogen content may be adjusted with respect to the adhesion characteristics rather than in view of the total permittivity and/or diffusion blocking properties. Thus, for a value of approximately 5-30 nm, for instance approximately 10 nm, for the thickness 257A, a nitrogen concentration of approximately 20-35 atomic percent may be included in the nitrogen-containing silicon carbide layer 257.

Moreover, a second dielectric layer 251 is formed on the first dielectric layer 257. The dielectric layer 251 may be formed of a material exhibiting a high diffusion blocking effect with respect to oxygen, moisture and copper so as to avoid undue diffusion of copper from the region 203 into adjacent dielectric materials still to be formed above the metal region 203, and also to suppress oxygen and moisture diffusion into the metal region 203.

In one illustrative embodiment, the dielectric layer 251 may be comprised of silicon nitride ($Si_3N_4$), which will also be referred to as SiN, wherein a thickness 251A of the dielectric layer 251 may be selected moderately thin due to the excellent diffusion blocking characteristics, thereby also reducing the influence of the layer 251 on the overall relative permittivity of the barrier layer stack still to be completed. For example, depending on the deposition techniques and any post-deposition treatments, the relative permittivity of the layer 251, when comprised of silicon nitride, may be approximately 7.0 and higher. Thus, in highly scaled semiconductor devices having critical feature sizes, such as the gate length of any MOS transistors (not shown) of 100 nm and even less, for instance 50 nm and less, the overall permittivity of the resulting interlayer dielectric stack of a metallization layer significantly influences the overall performance of the semiconductor device 200. Consequently, in some illustrative embodiments, the thickness 251A is selected to be approximately 20 nm and less, and may range, depending on the application under consideration, from approximately 5-20 nm. In one illustrative example, the thickness 251A is selected to be approximately 10 nm.

A typical process for manufacturing the semiconductor device 200, as shown in FIG. 2a, may comprise the following processes. First, any circuit elements or other micro-structural elements may be formed on and in the substrate 201 on the basis of well-established process techniques, including microelectronic techniques, such as photolithography, etching, implanting, deposition and the like. After the completion of any circuit elements, the metallization layer 202 may be formed on the basis of process techniques as will also be used for the formation of a subsequent metallization layer, as will be described later on. Hence, corresponding processes related to the layer 202 will not be described in detail. Next, the first dielectric layer 257 may be deposited by means of a plasma enhanced chemical vapor deposition process 253, during which a plasma ambient is established on the basis of appropriate precursor and carrier gases so as to enable the controlled deposition of an appropriate material, which, in one embodiment, is represented by nitrogen-containing silicon carbide, to form the layer 257 having the thickness 257A, which is controlled on the basis of a respectively-defined target value. It should be appreciated that, prior to the deposition process 253, any appropriate treatment may be performed to remove contaminants and surface irregularities from the region 203 and also from surface portions of the dielectric layer 204. In one illustrative embodiment, a plasma-based cleaning treatment may be performed to remove oxidized and eroded portions from the surface of the metal region 203 prior to the actual deposition process 253, wherein the plasma treatment is performed in situ with said deposition process 253, that is contact of the substrate 201 with ambient air is substantially suppressed when transiting from the plasma cleaning treatment to the actual deposition of the layer 257. For example, when depositing the layer 257 as an SiCN layer, an in situ plasma pretreatment may be performed on the basis of ammonia ($NH_3$) and nitrogen ($N_2$) and thereafter a precursor, such as 3MS or 4MS, may be supplied to establish the deposition ambient 253. It should be noted that, for establishing the plasma ambient for the deposition atmosphere 253, any appropriate deposition tool, such as the Producer™ system available from Applied Materials, Inc., may be used. In other illustrative embodiments, any required pre-deposition treatment may be performed on the basis of heat and/or chemical treatments, substantially without using a plasma ambient.

In one illustrative embodiment, using the above-specified deposition tool, SiCN may be deposited during the process 253 on the basis of the following process parameters. A pressure within the ambient of the deposition atmosphere 253 may be adjusted to be approximately 2.7-3.3 Torr, for instance approximately 3.0 Torr. The substrate temperature may be adjusted to be approximately 350-400° C., for example approximately 370° C. The deposition 253 may be based on trimethyl silane (3MS), ammonia ($NH_3$) and helium as precursor and carrier gases with flow rates of approximately 140-180 sccm, for instance approximately 160 sccm, approximately 300-360 sccm, for instance approximately 325 sccm, and approximately 350-450 sccm, for instance approximately 400 sccm, for 3MS, $NH_3$ and He, respectively. The RF (radio frequency) power may be selected to be approximately 250-350 watts, for instance approximately 300 watts, which may result in a deposition time of approximately 3-5 seconds with a film thickness 257A of approximately 90-110 Å, i.e., 8-12 nm. For the exemplary values indicated above, a deposition time of approximately 4.3 seconds results in an SiCN layer having a thickness of approximately 10 nm and a nitrogen content of approximately 25 atomic percent.

Next, the deposition ambient 253 is modified to enable the deposition of the second dielectric layer 251 so that the presence of oxygen and moisture after the deposition of the first layer 257 may be efficiently suppressed. For example, appropriate purge and pump steps may be performed to prepare the deposition ambient 253 for the in situ formation of the layer 251. In one illustrative embodiment, the layer 251 is provided as a silicon nitride layer, wherein, for the above-specified deposition tool, the following process parameters may be used. A pressure within the ambient of the deposition atmosphere 253 may be adjusted to be approximately 4.5-5.0 Torr, for instance approximately 4.8 Torr. The substrate temperature may be adjusted to be approximately 350-400° C., for example approximately 370° C. The deposition 253 may be based on silane ($SiH_4$), ammonia ($NH_3$) and nitrogen ($N_2$) as precursor and carrier gases with flow rates of approximately 120-170 sccm, for instance approximately 150 sccm, approximately 240-290 sccm, for instance approximately 260 sccm, and approximately 8,000-9,000 sccm, for instance approximately 8,600 sccm, for $SiH_4$, $NH_3$ and $N_2$, respectively. The RF (radio frequency) power may be selected to be approximately 400-600 watts, for instance approximately 520 watts, which may result in a deposition time of approximately 1-3 seconds with a film thickness 251A of approximately 80-120 Å, i.e., 8-12 nm. For the exemplary values indicated above, a deposition time of approximately 2 seconds results in a silicon nitride layer having a thickness of approximately 10 nm.

Figure 2B:
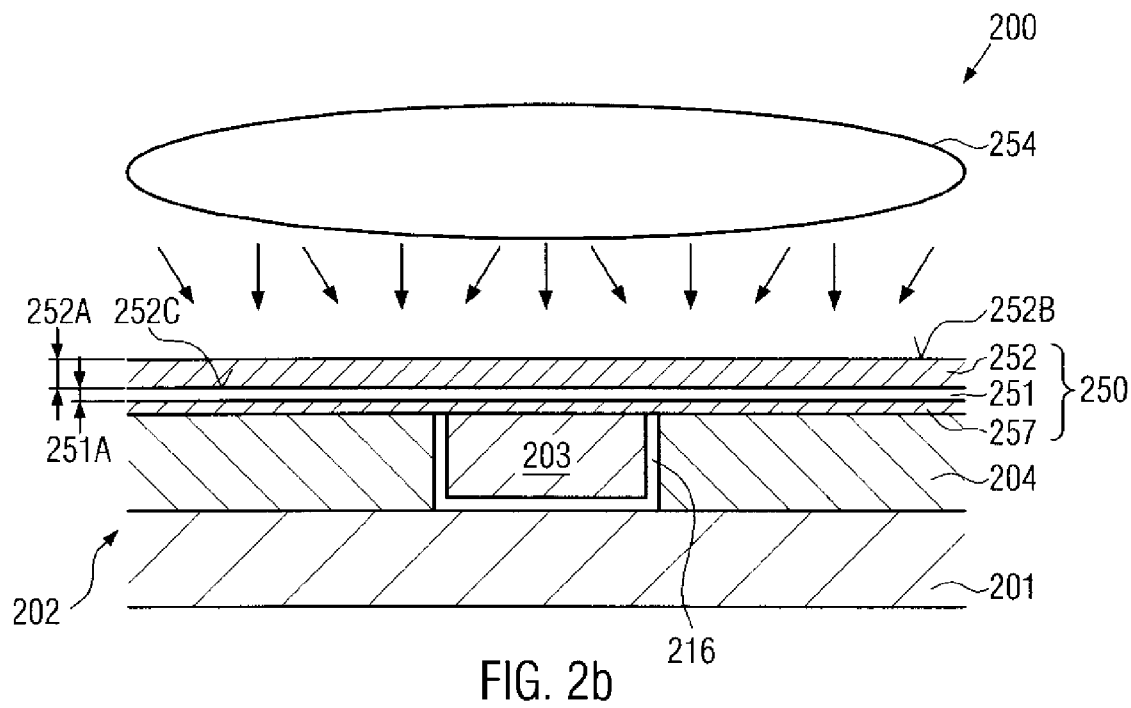

FIG. 2b schematically shows the semiconductor device 200 in a further advanced manufacturing stage. Here, a third dielectric layer 252 is formed above the second dielectric layer 251, wherein, in illustrative embodiments, the third dielectric layer 252 is directly formed on the second dielectric layer 251. In one illustrative embodiment, the dielectric layer 252 may be comprised of a material exhibiting an enhanced etch selectivity with respect to a subsequent via etch process so as to provide enhanced etch control compared to conventional approaches, in which a single material is used as etch stop and barrier layer for highly advanced semiconductor devices. As previously discussed with reference to FIGS. 1a-1e, nitrogen-containing silicon carbide (SiCN) is frequently used as an etch stop layer due to its superior characteristics with respect to permittivity and etch selectivity. The reduced moisture and oxygen blocking capability of nitrogen-containing silicon carbide, compromising the overall performance of the etch stop layer in conventional approaches, may be sufficiently compensated for in the present invention, since a barrier layer stack, which is indicated herein as 250 and which may be comprised in illustrative embodiments by the layers 251 and 252, significantly reduces the probability of surface defects within the metal region 203 due to the presence of the highly efficient oxygen and moisture blocking layer 251.

The third dielectric layer 252 has a thickness 252A that is selected to provide the required etch control in the subsequent via etch process. In illustrative embodiments, the thickness 252A may range from approximately 30-80 nm, for instance approximately 50 nm, when the layer 252 is substantially comprised of nitrogen-containing silicon carbide, wherein a nitrogen content may range from approximately 15-30 atomic percent, at least at an interface 252C. The layer 252 may be formed by a second deposition process 254 on the basis of a further plasma ambient, which may comprise silane-based precursor gases and ammonia in combination with an inert carrier gas, such as helium. In one illustrative embodiment, the process 254 may be performed on the basis of a plasma ambient including trimethyl silane (3MS) and ammonia and helium, while, in other embodiments, 4MS and ammonia and helium may be used. For example, when using a deposition tool, such as the above-specified Applied Material Producer™ system, the following parameter ranges may be used. The pressure within the plasma ambient of the process 254 may range from approximately 2.7-3.3 Torr, for instance 3.0 Torr. The temperature may range from approximately 330-400° C., for instance approximately 370° C. The flow rates for 3MS, ammonia and helium may range, respectively, from approximately 120-200 sccm, for instance 160 sccm, from approximately 290-360 sccm, for instance approximately 325 sccm, and from approximately 350-450 sccm, for instance approximately 400 sccm. The radio frequency power may be adjusted to approximately 270-330 watts, for instance approximately 300 watts.

With the above-specified parameters and a deposition time in the range of approximately 15-25 seconds, the thickness 252A may range from approximately 30-80 nm. As an illustrative example, a deposition time of approximately 21.5 seconds with the illustrative parameter values indicated above may result in a layer thickness of approximately 50 nm. It should be appreciated that the thickness 252A may be readily controlled on the basis of a predefined target value, which may represent a desired layer thickness so as to obtain the desired etch control in the subsequent via etch process.

In one illustrative embodiment, the barrier layer stack 250, comprised of the first layer 257, the second layer 251 and the third layer 252, may be formed in situ, i.e., the vacuum conditions during and in between the deposition processes 253 and 254 are substantially maintained throughout the whole process sequence, in which appropriate transition steps and stabilizing steps may be performed to transit from the deposition ambient of the process 253 to the deposition ambient of the process 254. Consequently, the metal region 203 may be effectively confined by the dielectric layer 251, thereby significantly reducing the probability of oxygen and moisture diffusion into the region 203. Furthermore, by maintaining the vacuum condition during the transition phase for establishing the deposition ambient of the process 254, any contact with oxygen and moisture with the layer 251 is significantly reduced, and, after the formation of the layer 252, an even enhanced confinement of the metal region 203 is accomplished. For example, for the above-specified deposition recipe of the process 253, an appropriately designed pump step may be performed to purge a corresponding process chamber after the deposition 253 with, for instance, nitrogen, so as to efficiently remove any deposition byproducts. Thereafter, the process chamber may be supplied with helium at the process pressure as required for the second deposition process 254. Thereafter, the precursor gases 3MS and ammonia may be additionally supplied while still substantially maintaining the same overall pressure. Thereafter, the actual deposition process 254 may be initiated by igniting the plasma by feeding the required RF power into the ambient of the deposition atmosphere 254. It should be appreciated, therefore, that the term "in situ" is to be understood as a process, during which a contact of the layer 251 after deposition with ambient air is substantially avoided and a vacuum condition, i.e., a pressure corresponding to the respective deposition pressures or less, is maintained throughout the first deposition 253 for forming the first and second layers 257 and 251 and the second deposition 254 and in any intermediate phase. This definition of the term "in situ" may not necessarily exclude processes performed in different process chambers, as long as an optional substrate transportation without contact to the ambient air is guaranteed. In other illustrative embodiments, the deposition processes 253 and 254, possibly in combination with a plasma pretreatment, may be performed in the same process chamber of an appropriate deposition tool.

In sophisticated applications, it may be desirable to provide the barrier layer stack 250 with a reduced amount of nitrogen, at least at a surface that may come into contact with a low-k dielectric material to be formed on the barrier layer stack 250. For example, it is believed that nitrogen that may be present within the vicinity of an interface formed between the barrier layer stack 250 and a low-k dielectric material may diffuse in the low-k dielectric material and may finally come into contact with a resist mask that may be used for the further patterning of the low-k dielectric material. In this case, nitrogen or any radicals created therefrom may significantly alter the photochemical behavior of the photoresist, thereby resulting in unwanted structural irregularities. Consequently, in some illustrative embodiments, the deposition process 254 may be controlled such that the contents of nitrogen within the layer 252 is reduced with increased process time. That is, with increasing thickness during the deposition 254, the nitrogen content may decrease, thereby resulting in a surface 252B having a reduced nitrogen content and, thus, a reduced probability for nitrogen diffusion into any resist masks used for patterning the subsequently formed low-k dielectric layer stack. For a deposition recipe as is specified above for the process 254, the ratio of 3MS and ammonia may substantially determine the amount of nitrogen incorporated into the layer 252. In order to obtain a significantly reduced nitrogen content at the surface 252B or to obtain a substantially nitrogen-free surface 252B, the supply of ammonia may be reduced or may be discontinued after a certain thickness is deposited. The point of time for discontinuing or reducing the ammonia supply may be selected on the basis of the target value for the thickness 252A such that a gradually decreasing amount of nitrogen incorporated into the remaining portion of the layer 252 is achieved. For example, approximately 20-50 nm, depending on the device requirements, may be deposited so as to include nitrogen with a concentration of approximately 15-30 atomic percent or even more. Then the ammonia supply may be discontinued or reduced, so that, for example, approximately 20-30 nm of silicon carbide of reduced nitrogen content may be formed in order to obtain the desired target thickness. Even for a complete stop of the ammonia supply, the resulting nitrogen content may exhibit a gradually decreasing profile, wherein the process parameters of the deposition 254 may be adjusted such that a substantially nitrogen-free surface 252B may be obtained. That is, the surface portion 252B may be considered as a silicon carbide layer. In other embodiments, the surface layer 252B may still comprise a certain, but reduced, nitrogen content.

Figure 2C:
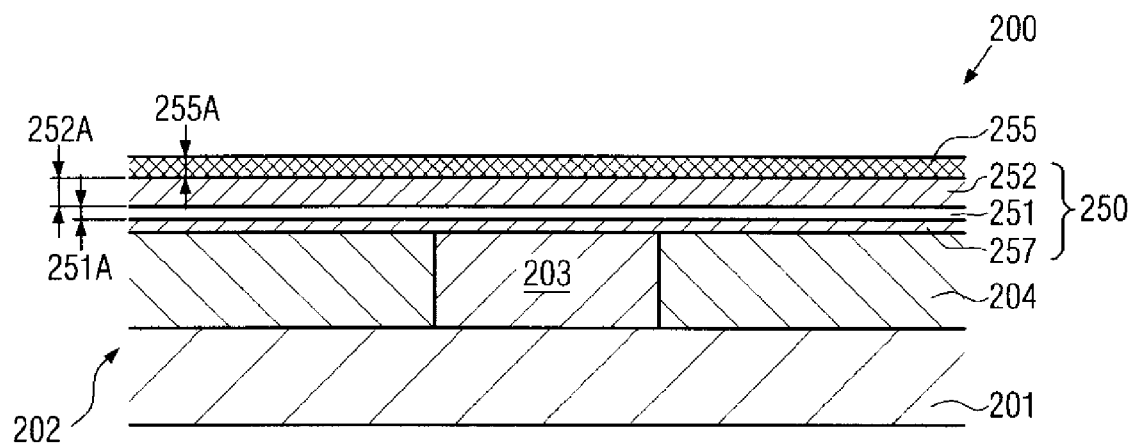

FIG. 2c schematically shows the semiconductor device 200 in accordance with another illustrative embodiment of the present invention, in which the barrier layer stack 250 may comprise a fourth dielectric layer 255 having a different material composition and/or thickness compared to at least the layer 252. For example, after the deposition of the layer 252 with the process 254, a further separate or in situ deposition process may be performed on the basis of an appropriate plasma-based deposition atmosphere so as to provide the fourth layer 255 with a thickness 255A, which is less than the thickness 252A. Thus, the layer 252 will still substantially determine the etch and permittivity characteristics of the total barrier layer stack 250. A previously explained, it may be considered advantageous to provide the fourth layer 255 substantially without any nitrogen therein so as to reduce nitrogen diffusion in subsequent processes. Therefore, in one illustrative embodiment, the layer 255 may be substantially comprised of silicon carbide, which exhibits a moderately low permittivity, thereby not unduly compromising the overall performance of the layer stack 250. The layer 255 may be deposited on the basis of 3MS or 4MS in combination with helium as is also explained with reference to FIG. 2b. In other embodiments, other nitrogen-free capping layers may be provided for the layer 255, for instance, comprised of silicon dioxide, wherein any negative impact of the oxygen during the formation of the silicon dioxide layer may be substantially prevented due to the provision of the second dielectric layer 251. Hence, an efficient barrier against nitrogen diffusion may be provided by the layer 255, wherein substantially no influence with respect to the subsequent etch process may be generated even when the layer 255 is comprised of silicon dioxide.

Figure 2D:
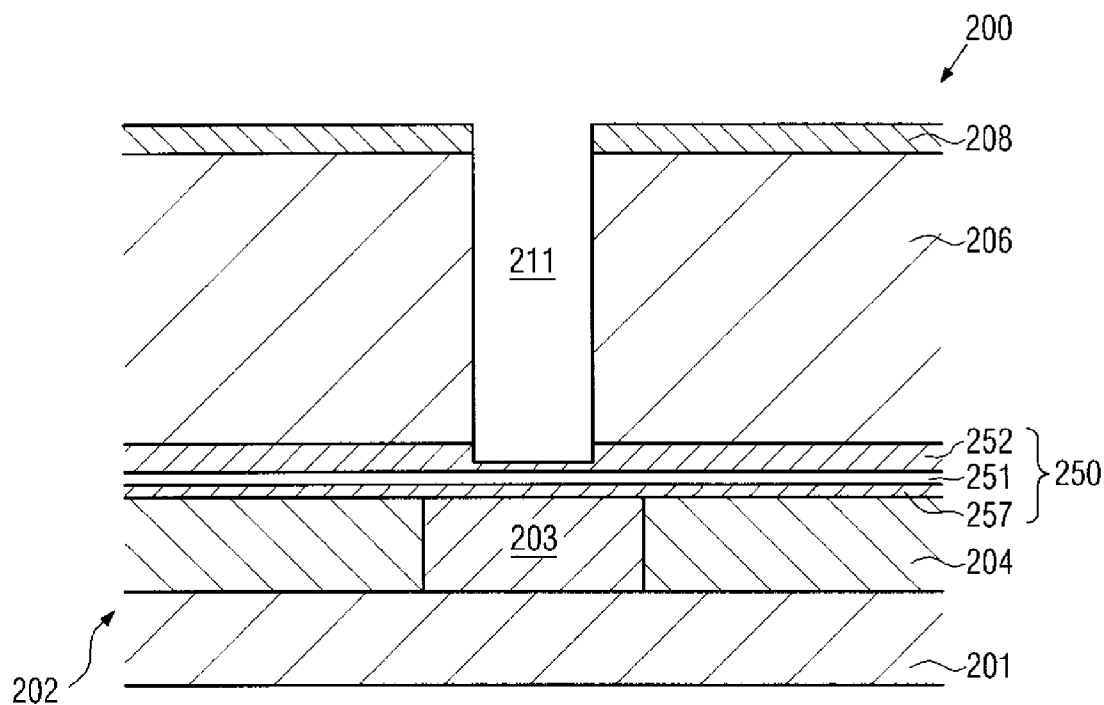

FIG. 2d schematically shows the semiconductor device 200 in a further advanced manufacturing stage, in which a low-k dielectric layer 206 is formed above the barrier layer stack 250 and a capping layer 208 may still be formed on top of the low-k dielectric material 206. Furthermore, a via opening 211 is formed through the low-k dielectric layer 206 and partially into the layer 252 of the stack 250. The semiconductor structure 200 may be formed in accordance with substantially the same processes as are previously described with reference to FIGS. 1a and 1b, wherein, during a corresponding anisotropic etch process, a high degree of etch selectivity is provided by the layer 252, thereby ensuring a reliable stop of the via etch process within the layer 252. Moreover, as previously pointed out, in some illustrative embodiments, the barrier layer 250 may have formed therein a substantially nitrogen-depleted portion, such as the layer 255, thereby also enhancing the overall performance of the etch process, as any undesired nitrogen-induced interactions with a corresponding resist mask may be significantly reduced. Thereafter, the further processing may be continued in a similar fashion as is also described with reference to FIGS. 1c-1e.

Figure 2E:
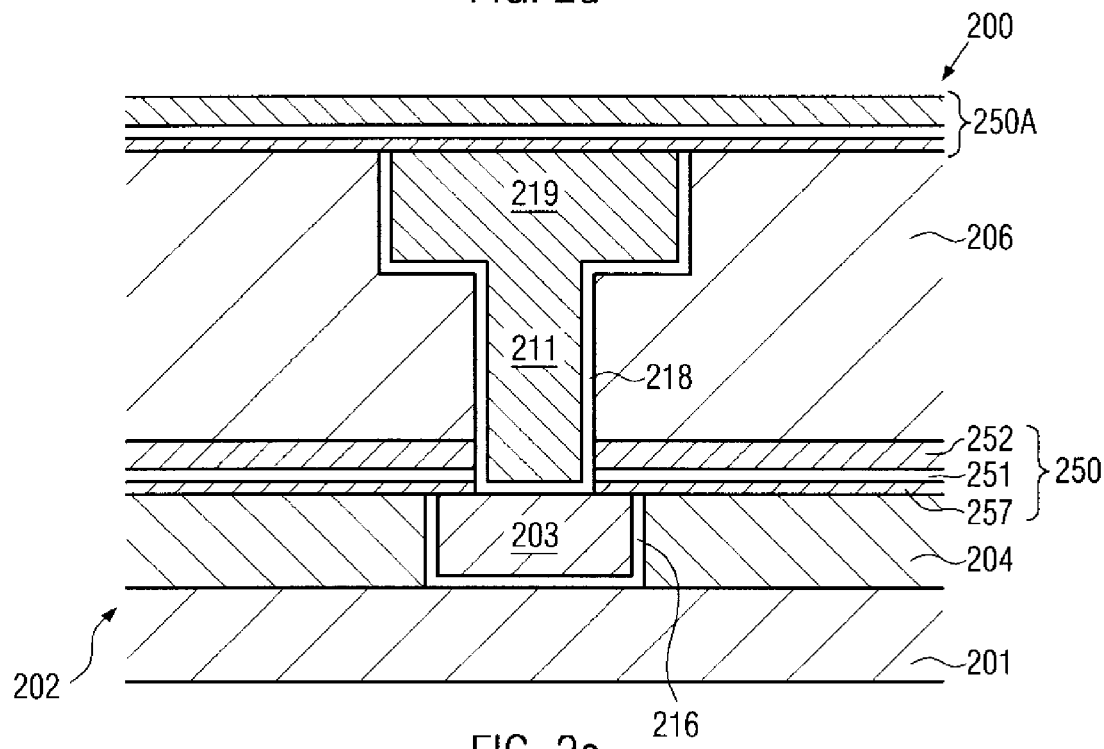

FIG. 2e schematically shows the semiconductor device 200 in a further advanced manufacturing stage, that is, after the formation of metal-filled vias and trenches in the low-k dielectric material layer 206 on the basis of well-established damascene techniques as are previously described.

Hence, the semiconductor device 200 comprises a copper-based metal 219 filled in a corresponding trench and the via opening 211, which is now in electrical contact with the region 203. Moreover, a conductive barrier layer 218 may be formed on sidewalls and bottom portions of the trench and via. Moreover, a second barrier layer stack 250A may be formed on the dielectric layer 206 and the metal 219, thereby confining the metal 219 and substantially reducing oxygen and moisture diffusion into the metal 219 while, on the other hand, providing a high adhesion and the required etch selectivity in a subsequent manufacturing process for forming a further metallization layer above the metal 219. Consequently, the second barrier layer stack 250A may have substantially the same configuration as is explained with reference to the barrier layer stack 250. It should be appreciated, however, that the barrier layer stacks 250 and 250A may not necessarily have an identical configuration within the same device. For example, in higher level metallization layers, an enhanced mechanical integrity of the metal 219 may be considered relevant and, thus, the barrier layer stack 250A may have a configuration as previously explained, while the layer stack 250 may still be formed in accordance with conventional manufacturing schemes, so that the stack 250 may actually be comprised of a single layer, such as a silicon nitride layer or a nitrogen-containing silicon carbide layer. In other embodiments, both the layer stack 250 and the layer stack 250A may have the enhanced performance characteristics according to the present invention, but may still differ in configuration due to process and device requirements. For example, the layer stack 250 may be comprised of a four-layer configuration, for instance, including a substantially nitrogen-free top layer as is explained with reference to the layer 255 (FIG. 2*c*) or the dielectric layer 252 may have a reduced nitrogen content at the top surface 252B (FIG. 2*b*) in order to enhance the patterning process when highly sophisticated photoresists are used. In other cases, the material of the top layer 255, if provided, may be selected differently for different layer stacks 250, 250A, while, in other embodiments, the stack 250A may be a four-level stack with reduced nitrogen diffusion, while the stack 250 may be comprised of three layers.

As a result, the present invention provides a technique for the formation of an enhanced barrier layer stack that provides increased confinement of a copper-containing metal, while providing enhanced adhesion and reduced oxygen and moisture incorporation into surface portions of the confined metal, thereby providing the potential for increasing the electromigration performance of the confined metal. Furthermore, a high degree of etch selectivity is still maintained, since the substantial part of the barrier layer stack, i.e., the layer 252 having the greatest thickness, is comprised of a material showing an increased etch selectivity compared to the underlying diffusion-blocking material. In addition, since the substantial part of the barrier layer stack is comprised of a material having the required low relative permittivity, an undue impact on the overall performance of the semiconductor device may be effectively suppressed, nevertheless providing enhanced copper integrity. The deposition processes for forming the barrier layer stack may be advantageously performed as an in situ process sequence, thereby also reducing process complexity compared to conventional approaches, wherein, in some embodiments, an in situ pretreatment may be performed to even more enhance the adhesion of the first layer 257 to the underlying metal. Additionally, in some illustrative embodiments, even a substantially nitrogen-free top layer may be provided in the barrier layer stack, without undue effects on the overall relative permittivity, thereby significantly reducing the probability of resist poisoning during the patterning of the low-k dielectric material in accordance with established damascene techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a dielectric barrier layer stack by:
      depositing a first dielectric layer having a first thickness on a metal region formed above a substrate;
      depositing a second dielectric layer in situ on said first dielectric layer, said second dielectric layer having a second thickness;
   depositing a third dielectric layer having a third thickness on said second dielectric layer, said first and second thicknesses each being less than said third thickness, wherein a nitrogen concentration of said third dielectric layer is reduced at a surface of said third dielectric layer; and
   forming a low-k dielectric layer having a fourth thickness greater than a sum of the first, second, and third thicknesses directly on said surface of said third dielectric layer of said dielectric barrier layer stack.

2. The method of claim 1, wherein depositing said first, second and third dielectric layers is performed in situ.

3. The method of claim 1, further comprising treating an exposed surface of said metal region with a reactive plasma ambient and depositing at least said first and second dielectric layers without breaking vacuum after said treatment.

4. The method of claim 1, wherein said first dielectric layer is deposited on the basis of a first plasma ambient comprising a nitrogen-containing precursor and one of trimethyl silane and tetramethyl silane.

5. The method of claim 4, wherein said second dielectric layer is deposited on the basis of a second plasma ambient comprising silane and ammonia (NH3).

6. The method of claim 4, wherein said third dielectric layer is deposited on the basis of said first plasma ambient.

7. The method of claim 1, wherein depositing said first, second and third dielectric layers comprises controlling said first thickness on the basis of a first target value ranging from approximately 5-30 nm, controlling said second thickness on the basis of a second target value ranging from approximately 5-20 nm, and controlling said third thickness on the basis of a third target value ranging from approximately 30-80 nm.

8. The method of claim 1, wherein depositing said third dielectric layer comprises controlling at least one deposition parameter to create said reduced nitrogen concentration at said surface of said third dielectric layer.

9. The method of claim 1, wherein forming said third dielectric layer further comprises forming a surface portion of said third dielectric layer, said surface portion having a reduced nitrogen content.

10. The method of claim 1, further comprising etching an opening through said low-k dielectric layer and using said third dielectric layer for controlling said etch process.

11. A method comprising:
forming a low-k dielectric barrier layer stack on a metal region in a metallization structure of a semiconductor device by depositing, in situ, according to the following order:
a first nitrogen-containing silicon carbide (SiCN) layer on said metal region;
a silicon nitride ($Si_3N_4$) layer formed directly on said first nitrogen-containing silicon carbide (SiCN) layer; and
a second nitrogen-containing silicon carbide (SiCN) layer formed directly on said silicon nitride layer.

12. The method of claim 11, wherein a thickness of said first nitrogen-containing silicon carbide (SiCN) layer and a thickness of said silicon nitride layer each are less than a thickness of said second nitrogen-containing silicon carbide (SiCN) layer deposited as the last layer.

13. The method of claim 1, wherein the first dielectric layer comprises nitrogen-containing silicon carbide (SiCN), the second dielectric layer comprises silicon nitride, and the third dielectric layer comprises nitrogen-containing silicon carbide (SiCN).

14. The method of claim 1, wherein the first dielectric layer comprises an adhesion layer, the second dielectric layer comprises a barrier layer, and the third dielectric layer comprises an etch stop layer.

15. The method of claim 1, wherein none of the first, second, and third dielectric layers comprises a low-k material.

16. The method of claim 11, wherein forming said second nitrogen-containing silicon carbide (SiCN) layer further comprises reducing a nitrogen concentration during an end portion of the forming to form a portion having a reduced nitrogen concentration as compared to the second nitrogen-containing silicon carbide (SiCN).

* * * * *